(12) United States Patent
Kobayashi

(10) Patent No.: US 9,871,131 B2
(45) Date of Patent: Jan. 16, 2018

(54) SEMICONDUCTOR DEVICE WITH INSULATING SECTION OF VARYING THICKNESS

(71) Applicant: KABUSHIKI KAISHA TOSHIBA, Minato-ku, Tokyo (JP)

(72) Inventor: Kenya Kobayashi, Ishikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/251,805

(22) Filed: Aug. 30, 2016

(65) Prior Publication Data

US 2017/0263752 A1    Sep. 14, 2017

(30) Foreign Application Priority Data

Mar. 9, 2016  (JP) .................................. 2016-045634

(51) Int. Cl.
*H01L 29/78* (2006.01)
*H01L 29/40* (2006.01)
(Continued)

(52) U.S. Cl.
CPC ...... *H01L 29/7811* (2013.01); *H01L 29/0696* (2013.01); *H01L 29/0886* (2013.01);
(Continued)

(58) Field of Classification Search
CPC ........... H01L 29/7813; H01L 29/42368; H01L 29/407; H01L 29/0886; H01L 29/7811
See application file for complete search history.

(56) References Cited

U.S. PATENT DOCUMENTS 5,637,898 A    6/1997  Baliga
5,998,833 A    12/1999  Baliga
(Continued)

FOREIGN PATENT DOCUMENTS

JP    2010-251608 A    11/2010

OTHER PUBLICATIONS

Baba et al: "A Study on a High Blocking Voltage UMOS-FET with a Double Gate Structure", Proceedings of 1992 International Symposium on Power Semiconductor Devices & ICs, Tokyo, pp. 300-302.

(Continued)

*Primary Examiner* — Daniel Luke
(74) *Attorney, Agent, or Firm* — Foley & Lardner LLP

(57) ABSTRACT

A semiconductor device includes a first semiconductor region of a first conductivity type, a second semiconductor region of a second conductivity type on the first semiconductor region, a first electrode surrounded by the first semiconductor region and including a first electrode portion and a second electrode portion provided on the first electrode portion, and a first insulating section including first and second insulating portions. The second insulating portion is arranged side by side with the second electrode portion in a second direction perpendicular to a first direction from the first semiconductor region to the second semiconductor region. The first insulating portion is arranged side by side with the first electrode portion in the second direction. A length and a thickness of the first insulating portion in the first direction are greater than a length and a thickness of the second insulating portion in the first direction, respectively.

20 Claims, 6 Drawing Sheets

(51) Int. Cl.
*H01L 29/06* (2006.01)
*H01L 29/423* (2006.01)
*H01L 29/08* (2006.01)
*H01L 29/66* (2006.01)

(52) U.S. Cl.
CPC ...... *H01L 29/407* (2013.01); *H01L 29/42368* (2013.01); *H01L 29/66734* (2013.01); *H01L 29/7813* (2013.01)

(56) References Cited

U.S. PATENT DOCUMENTS

| | | | |
|---|---|---|---|
| 7,504,303 B2 | 3/2009 | Iyilmaz et al. | |
| 2012/0241854 A1* | 9/2012 | Ohta | H01L 29/0856 257/331 |
| 2012/0326227 A1* | 12/2012 | Burke | H01L 29/407 257/330 |
| 2013/0153995 A1 | 6/2013 | Misawa et al. | |
| 2014/0054682 A1* | 2/2014 | Padmanabhan | H01L 29/404 257/330 |

OTHER PUBLICATIONS

Chen et al: "Design of Gradient Oxide-Bypassed Superjunction Power MODFET Devices", IEEE Transactions on Power Electronics, vol. 22, No. 4, Jul. 2007, pp. 1303-1310.

Deng et al: "Doping Engineering for Improved Immunity against BV Softness and BV Shift in Trench Power MOSFET", Proceedings of the 2016 28th International Symposium on Power Semiconductor Devices and ICs (ISPSD), Jun. 2016, Prague, Czech Republic, pp. 375-378.

Gajda et al: "Industrialisation of Resurf Stepped Oxide Technology for Power Transistors", Proceedings of the 18th International Symposium on Power Semiconductor Devices & IC's, Jun. 2006 Naples, Italy, pp. 109-112.

Goarin et al: "Split-gate Resurf Stepped Oxide (RSO) MOSFETs for 25V applications with record low gate-to-drain charge", Proceedings of the 19th International Symposium on Power Semiconductor Devices & ICs, May 2007, Jeju, Korea, pp. 61-64.

Kobayashi et al: "100 V Class Multiple Stepped Oxide Field Plate Trench MOSFET (MSO-FP-MOSFET) Aimed to Ultimate Structure Realization", Proceedings of the 27th International Symposium on Power Semiconductor Devices & IC's, May 2015, Kowloon Shangri-La, Hong Kong, pp. 141-144.

Kobayashi et al: "An 18V N-channel UMOSFET with Super Low On-resistance by using Vertitcal Resurf Structure", The Papers of Joint Technical Meeting on "Electron Devices" and "Semiconductor Power Converter", IEE Japan, EDD-12-068, SPC-12-141, 2012, pp. 49-53.

Kodama et al: "Temperature characteristics of a new 100V rated power MOSFET, VLMOS (Vertical LOCOS MOS)", Proceedings of 2004 International Symposium on Power Semiconductor Devices & ICs, Kitakyushu, pp. 463-466.

Koops et al: "Resurf Stepped Oxide (RSO) MOSFET for 85V having a record-low specific on resistance", Proceedings of 2004 International Symposium on Power Semiconductor Devices & ICs, Kitakyushu, pp. 185-188.

* cited by examiner

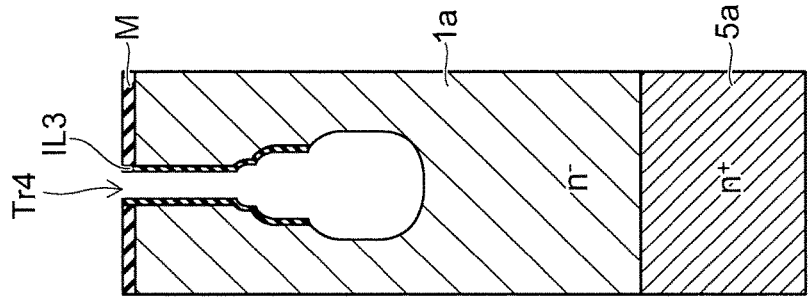
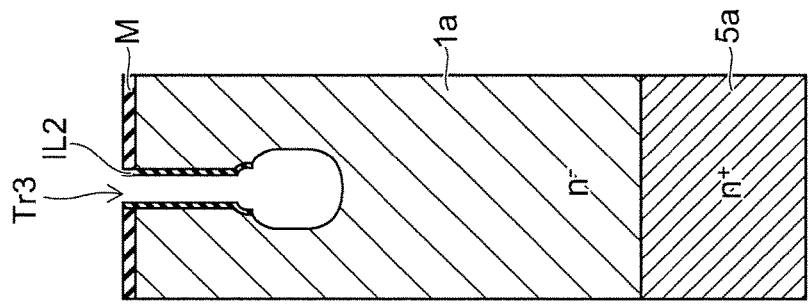
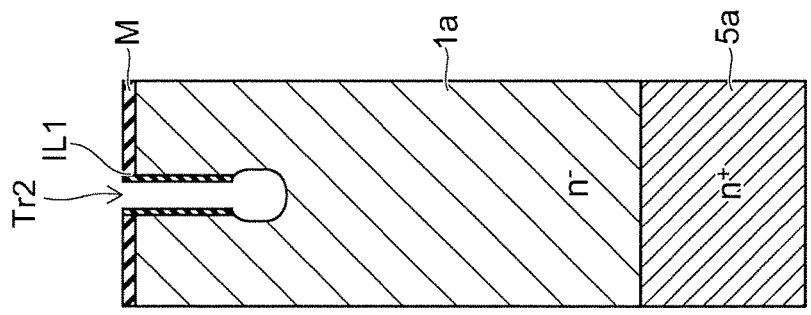
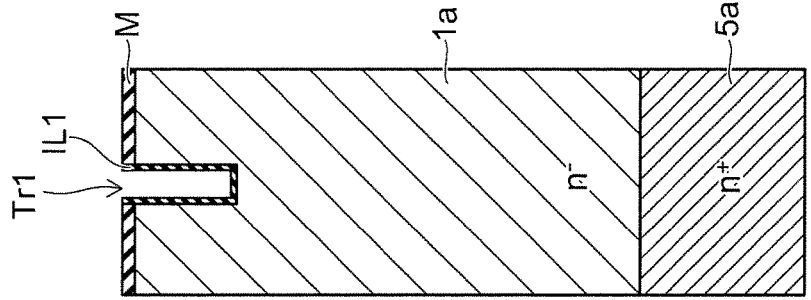

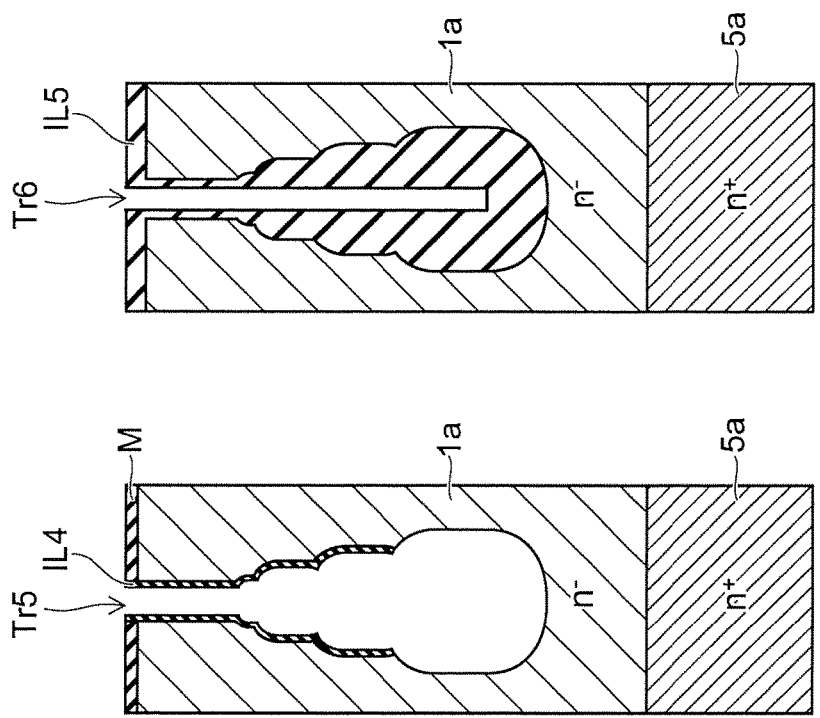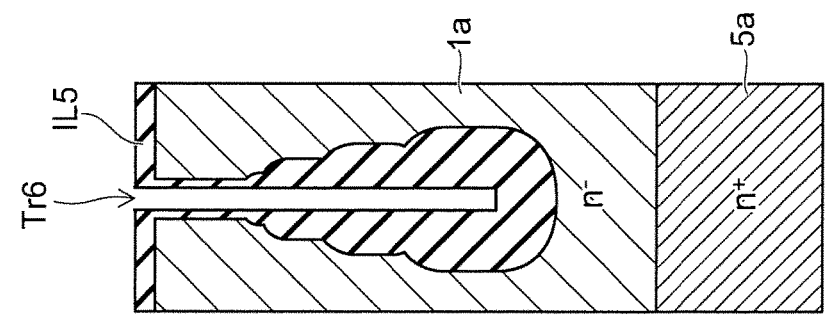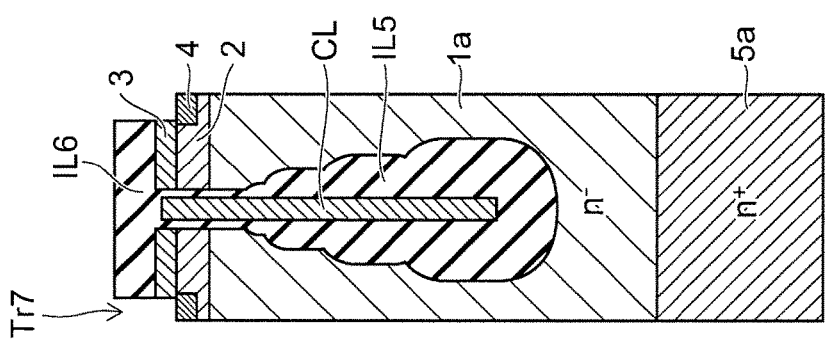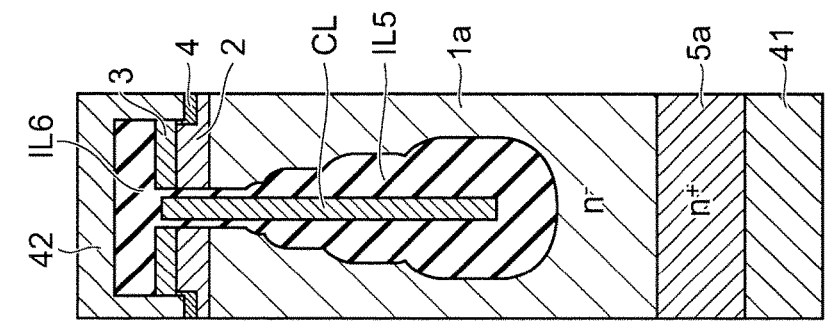

FIG. 5
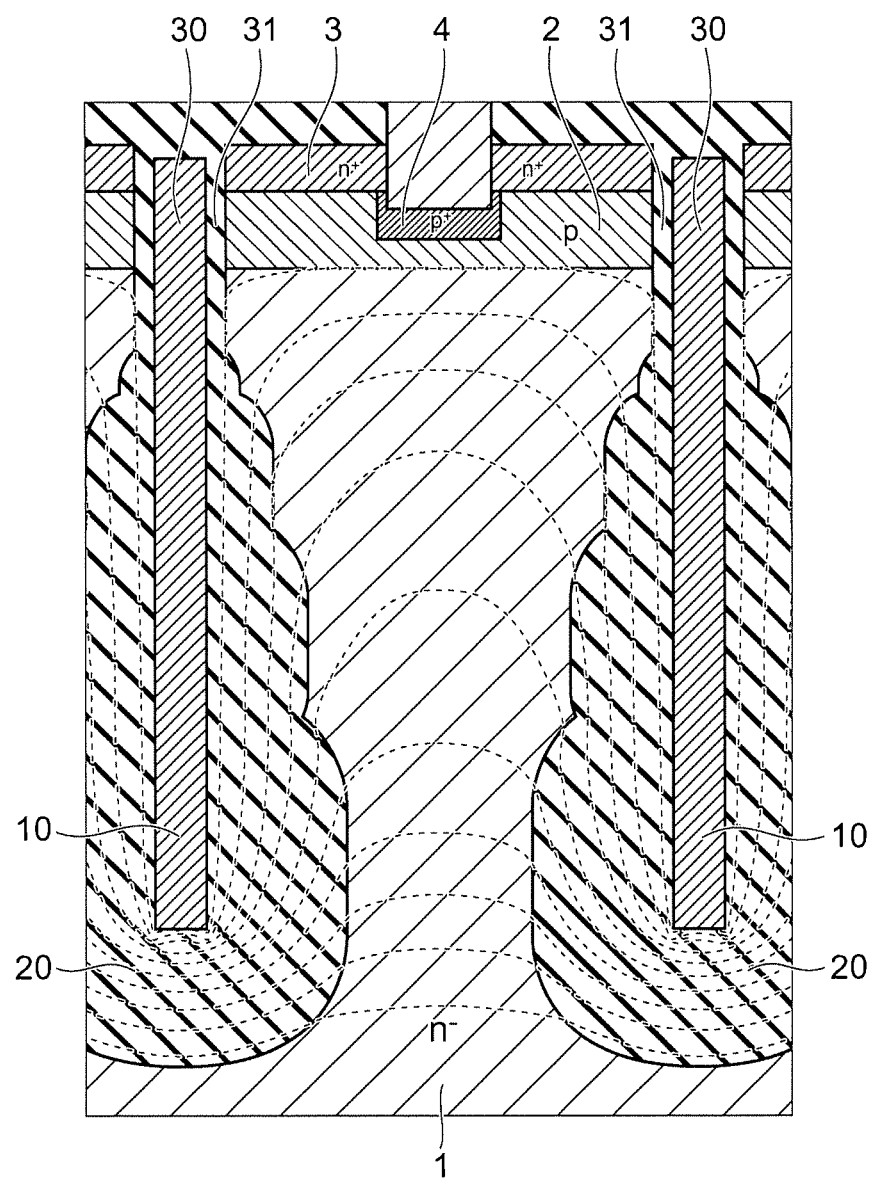
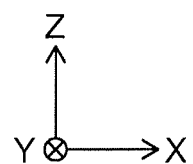

SEMICONDUCTOR DEVICE WITH INSULATING SECTION OF VARYING THICKNESS

CROSS-REFERENCE TO RELATED APPLICATION

This application claims the benefit of and priority to Japanese Patent Application No. 2016-045634, filed Mar. 9, 2016, the entire contents of which are incorporated herein by reference.

FIELD

Embodiments described herein relate generally to a semiconductor device.

BACKGROUND

Semiconductor devices, such as metal oxide semiconductor field effect transistors (MOSFETs), can be used for the purpose of, for example, power conversion. In some semiconductor devices, to increase the breakdown voltage thereof, a field plate electrode is provided under a gate electrode. With regard to such semiconductor devices, a further improvement in breakdown voltage is desired.

SUMMARY

In some embodiments according to one aspect, a semiconductor device may include a first semiconductor region of a first conductivity type, a second semiconductor region of a second conductivity type provided on the first semiconductor region, a third semiconductor region of the first conductivity type selectively provided on the second semiconductor region, a first electrode surrounded by the first semiconductor region, a first insulating section provided between the first electrode and the first semiconductor region, a gate electrode provided on the first electrode, and a gate insulating section provided between the gate electrode and the second semiconductor region. The first electrode may include a first electrode portion, and a second electrode portion provided on the first electrode portion. The first insulating section may include a second insulating portion arranged side by side with the second electrode portion in a second direction perpendicular to a first direction from the first semiconductor region to the second semiconductor region, and a first insulating portion arranged side by side with the first electrode portion in the second direction. A length of the first insulating portion in the first direction may be greater than a length of the second insulating portion in the first direction. A thickness of the first insulating portion in the second direction may be greater than a thickness of the second insulating portion in the second direction.

In some embodiments according to another aspect, a semiconductor device may include a first semiconductor region of a first conductivity type, a second semiconductor region of a second conductivity type provided on the first semiconductor region, a third semiconductor region of the first conductivity type selectively provided on the second semiconductor region, a fourth semiconductor region of the second conductivity type selectively provided on the second semiconductor region, a first electrode surrounded by the first semiconductor region, a first insulating section provided between the first electrode and the first semiconductor region, a gate electrode provided on the first electrode, a gate insulating section provided between the gate electrode and the second semiconductor region, and a source electrode provided on the third semiconductor region and the fourth semiconductor region and electrically connected to the third semiconductor region and the fourth semiconductor region. A width of the gate electrode in a second direction perpendicular to a first direction from the first semiconductor region to the second semiconductor region may be approximately equal to a width of the first electrode in the second direction. A thickness of the gate insulating section in the second direction may be less than a thickness of the first insulating section in the second direction.

Other aspects and embodiments of the disclosure are also encompassed. The foregoing summary and the following detailed description are not meant to restrict the disclosure to any particular embodiment but are merely meant to describe some embodiments of the disclosure.

DESCRIPTION OF THE DRAWINGS

FIG. 3A, FIG. 3B, FIG. 3C, and FIG. 3D are process cross-sectional views illustrating a manufacturing process for the semiconductor device according to some embodiments.

FIG. 4A, FIG. 4B, FIG. 4C, and FIG. 4D are process cross-sectional views illustrating the manufacturing process for the semiconductor device according to some embodiments.

FIG. 5 is a cross-sectional view illustrating equipotential lines in a portion of the semiconductor device according to some embodiments.

DETAILED DESCRIPTION

Figure 1:
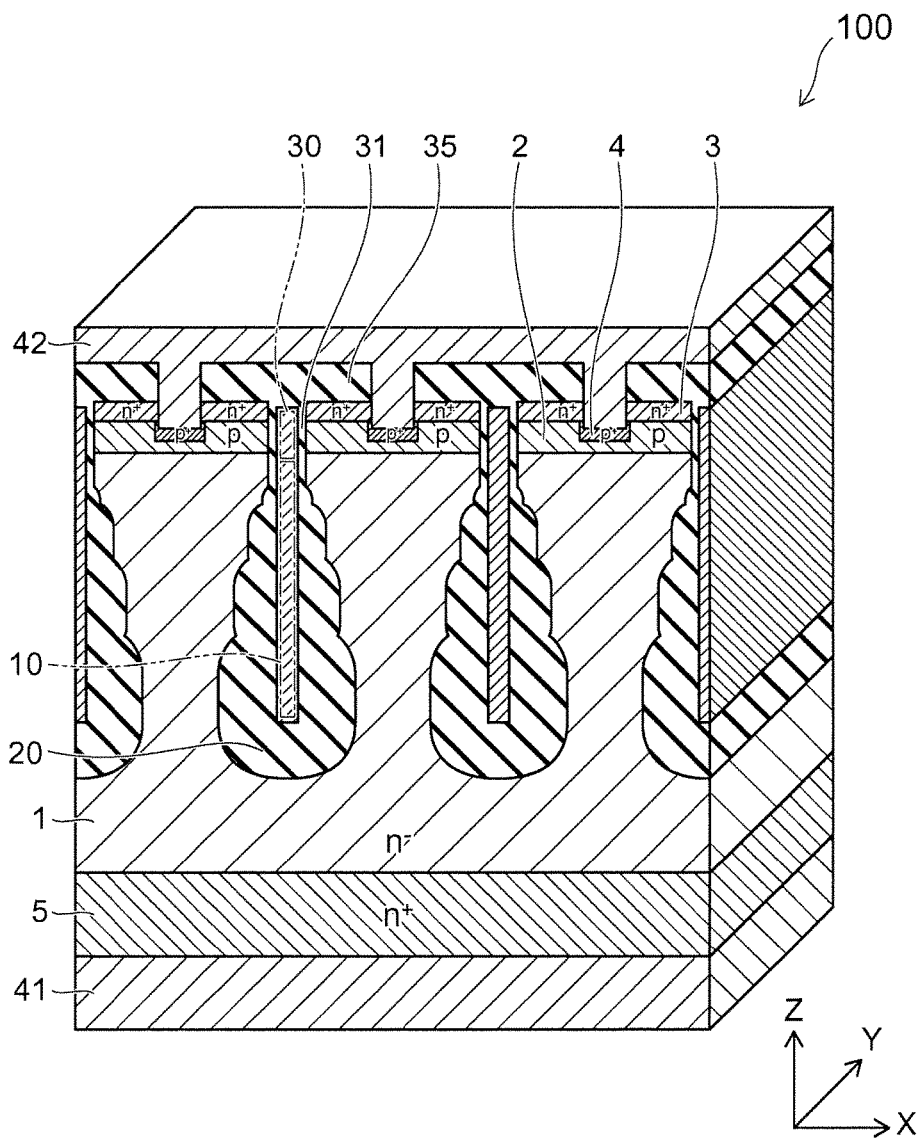
FIG. 1 is a cross-sectional view illustrating a part of a semiconductor device according to some embodiments.

An object of some embodiments is to provide a semiconductor device allowing an improvement in breakdown voltage thereof.

In general, according to some embodiments, a semiconductor device includes a first semiconductor region of a first conductivity type, a second semiconductor region of a second conductivity type, a third semiconductor region of the first conductivity type, a first electrode, a first insulating section, a gate electrode, and a gate insulating section.

The second semiconductor region is provided on the first semiconductor region.

The third semiconductor region is selectively provided on the second semiconductor region.

The first electrode includes a first electrode portion and a second electrode portion provided on the first electrode portion. The first electrode is surrounded by the first semiconductor region.

The first insulating section includes a first insulating portion and a second insulating portion. The second insulating portion is arranged side by side with the second electrode portion in a second direction perpendicular to a first direction followed from the first semiconductor region to the second semiconductor region. The first insulating portion is arranged side by side with the first electrode portion in the second direction. A length of the first insulating portion in the first direction is greater than a length of the second insulating portion in the first direction. A thickness of the first insulating portion in the second direction is greater than a thickness of the second insulating portion in the second direction.

The first insulating section is provided between the first electrode and the first semiconductor region.

The gate electrode is provided on the first electrode.

The gate insulating section is provided between the gate electrode and the second semiconductor region.

Hereinafter, embodiments will be described with reference to the drawings.

Furthermore, the drawings may be schematic or conceptual ones, and the relationship in thickness and width between various regions, sections, and portions, the ratio in size between various regions, sections, and portions, and other factors are not necessarily the same as the actual ones. Moreover, even when the same regions, sections, and portions are illustrated, the illustrated dimensions or ratios of the various regions, sections, and portions may vary with the drawings.

Additionally, in the present specification and drawings, elements similar to those already described are assigned the respective same reference characters, and the detailed description thereof may be omitted as appropriate.

In the description of some embodiments, an XYZ orthogonal coordinate system is used. For example, a direction from an n⁻-type semiconductor region 1 to a p-type base region 2 is referred to as a "Z-direction" (e.g., as a first direction). Two directions that are perpendicular to the Z-direction and are orthogonal to each other are referred to as an "X-direction" (e.g., as a second direction) and a "Y-direction". By perpendicular or orthogonal, the terms can refer to precisely 90° as well as a range of variation of less than or equal to ±5° relative to 90°, such as less than or equal to ±4°, less than or equal to ±3°, less than or equal to +2°, or less than or equal to ±1°. In the description of some embodiments, an element provided "on" another element can encompass cases where the former element is directly on (e.g., in physical contact with) the latter element, as well as cases where one or more intervening elements are located between the former element and the latter element. In the description of some embodiments, an element provided "beneath" another element can encompass cases where the former element is directly beneath (e.g., in physical contact with) the latter element, as well as cases where one or more intervening elements are located between the former element and the latter element. In the description of some embodiments, when referring to two values or characteristics as being approximately the same or approximately equal, the terms can refer to precisely the same or equal as well as a range of variation of less than or equal to ±5% relative an average of the values or characteristics, such as less than or equal to ±4%, less than or equal to ±3%, less than or equal to ±2%, or less than or equal to ±1%.

In the following description, symbols n⁺, n, and n⁻ represent relative highness or lowness of an impurity (or a dopant) concentration in a particular conductivity type (e.g., a first conductivity type). Similarly, symbols p⁺, p, and p⁻ represent relative highness or lowness of an impurity concentration in another conductivity type (e.g., a second conductivity type). More specifically, the symbol suffixed with "+" indicates that the impurity concentration is relatively higher than that in the symbol suffixed with neither of "+" and "−", and the symbol suffixed with "−" indicates that the impurity concentration is relatively lower than that in the symbol suffixed with neither of "+" and "−".

In the embodiments described below, the p type and n type of semiconductor regions can be replaced with each other.

An example of a semiconductor device according to some embodiments is described with reference to FIG. 1 and FIG. 2.

FIG. 1 is a cross-sectional view illustrating a part of a semiconductor device 100 according to some embodiments.

Figure 2:
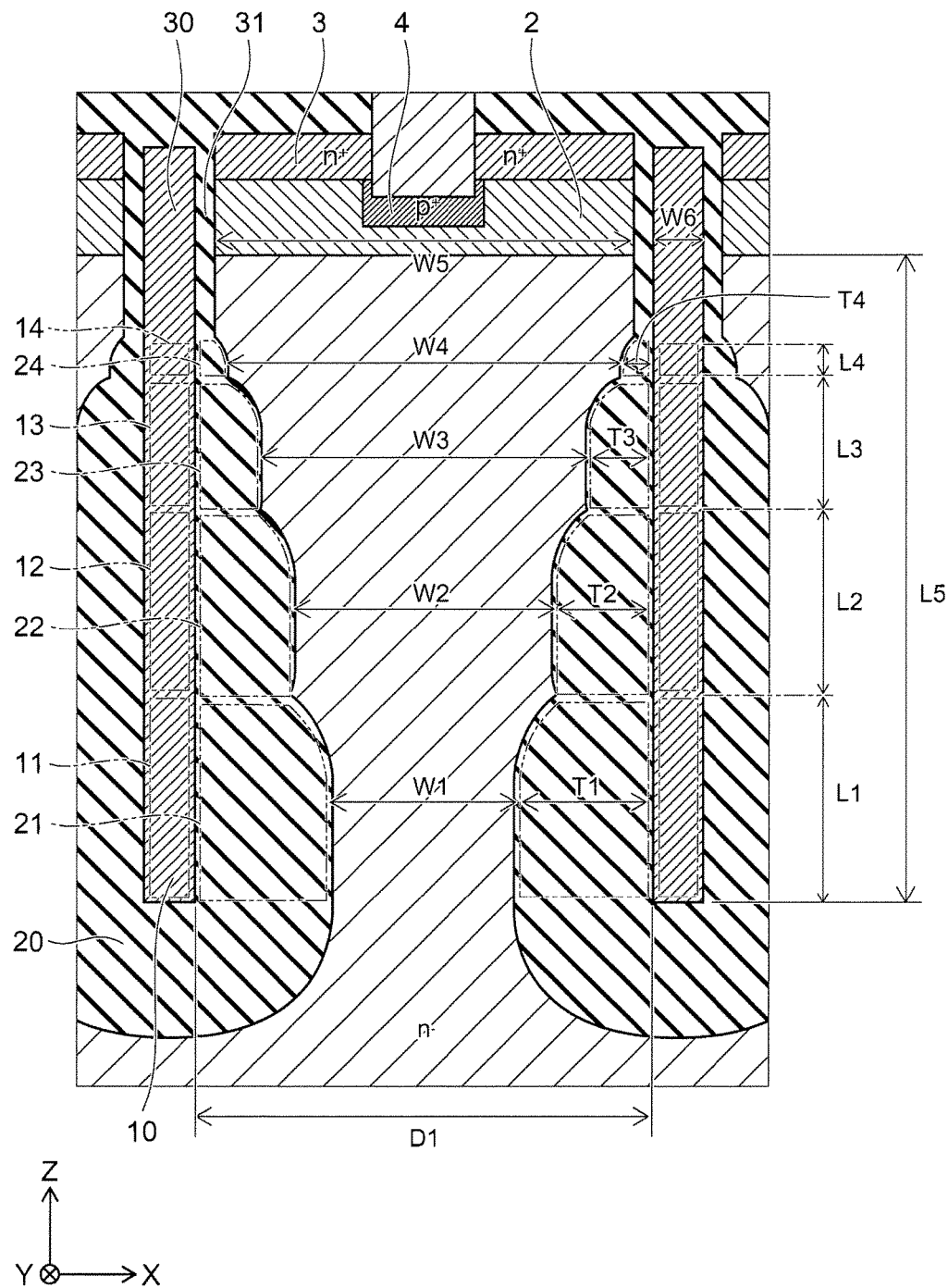
FIG. 2 is a cross-sectional view obtained by enlarging a portion illustrated in FIG. 1.

FIG. 2 is a cross-sectional view obtained by enlarging a portion illustrated in FIG. 1.

In some embodiments, the semiconductor device 100 is, for example, a MOSFET.

As illustrated in FIG. 1 and FIG. 2, in some embodiments, the semiconductor device 100 includes an n⁺-type (e.g., as a first conductivity type) drain region 5, an n⁻-type (e.g., as the first conductivity type) semiconductor region 1 (e.g., as the first semiconductor region or a substrate region), a p-type (e.g., as a second conductivity type) base region 2 (e.g., as a second semiconductor region), an n⁺-type (e.g., as the first conductivity type) source region 3 (e.g., as a third semiconductor region), a p⁺-type (e.g., as the second conductivity type) contact region 4, a field plate electrode (hereinafter referred to as an "FP electrode") 10 (e.g., as a first electrode), an insulating section 20 (e.g., as a first insulating section or an FP electrode insulating section), a gate electrode 30, a gate insulating section 31, an insulating layer 35, a drain electrode 41, and a source electrode 42.

As illustrated in FIG. 1, in some embodiments, the drain electrode 41 is provided as a lower surface of the semiconductor device 100.

The n⁺-type drain region 5 is provided on the drain electrode 41 and is electrically connected to the drain electrode 41.

The n⁻-type semiconductor region 1 is provided on the n⁺-type drain region 5.

The p-type base region 2 is provided on the n⁻-type semiconductor region 1. The p-type base region 2 includes a plurality of p-type base regions arranged in the X-direction. In some embodiments, each of the plurality of p-type base regions extends in the Y-direction.

In some embodiments, the n⁺-type source region 3 and the p⁺-type contact region 4 are selectively provided on the p-type base region 2.

The FP electrode 10 is surrounded by the n⁻-type semiconductor region 1 along the X-Y plane.

The insulating section 20 is provided around (or surrounds) the FP electrode 10 and is located between the FP electrode 10 and the n⁻-type semiconductor region 1.

The gate electrode 30 is provided on the FP electrode 10. The gate electrode 30 is arranged side by side with the p-type base region 2 in the X-direction. The gate insulating section 31 is provided between the gate electrode 30 and the p-type base region 2. In some embodiments, the insulating section 20 and the gate insulating section 31 may be different parts of an insulating layer; for example, the insulating section 20 and the gate insulating section 31 may be integrally formed with one another, without an interface or boundary between the sections 20 and 31.

The FP electrode 10 and the gate electrode 30 respectively include a plurality of FP electrodes and a plurality of gate electrodes arranged in the X-direction. In some embodiments, each of the plurality of FP electrodes and the plurality of gate electrodes extends in the Y-direction.

The source electrode 42 is provided on the n⁺-type source region 3, the p⁺-type contact region 4, and the gate electrode 30 and is electrically connected to the n⁺-type source region 3 and the p⁺-type contact region 4. More specifically, the $p^+$-type contact region 4 is located lower than the $n^+$-type source region 3, and the source electrode 42 is in contact with the side surface of the $n^+$-type source region 3 and the upper surface of the $p^+$-type contact region 4.

The insulating layer 35 is provided between the gate electrode 30 and the source electrode 42, which are thus electrically separated from each other. In some embodiments, the gate insulating section 31 and the insulating layer 35 may be different parts of an insulating layer; for example, the gate insulating section 31 and the insulating layer 35 may be integrally formed with one another, without an interface or boundary between the gate insulating section 31 and the insulating layer 35.

In some embodiments, when, while a positive voltage with respect to the source electrode 42 is applied to the drain electrode 41, a voltage higher than or equal to a threshold value is applied to the gate electrode 30, the semiconductor device 100 enters an on-state. At this time, an inversion channel is formed in an area of the p-type base region 2 near the gate insulating section 31.

In some embodiments, when the semiconductor device 100 is in an off-state and a positive voltage is applied to the drain electrode 41 with respect to the gate electrode 30, a depletion layer spreads from the interface between the insulating section 20 and the $n^-$-type semiconductor region 1 toward the $n^-$-type semiconductor region 1. The depletion layer, which spreads from the interface between the insulating section 20 and the $n^-$-type semiconductor region 1, can improve the breakdown voltage of the semiconductor device 100. Alternatively, increasing the n-type impurity concentration in the $n^-$-type semiconductor region 1 as much as an increase in breakdown voltage of the semiconductor device 100 can reduce the on-state resistance of the semiconductor device 100.

Next, structures of the FP electrode 10 and the insulating section 20 are more specifically described with reference to FIG. 2.

In some embodiments, the FP electrode 10 includes a first electrode portion 11, a second electrode portion 12, a third electrode portion 13, and a fourth electrode portion 14. The first electrode portion 11 is a portion including a lower end of the FP electrode 10. The second electrode portion 12 is provided on the first electrode portion 11. The third electrode portion 13 is provided on the second electrode portion 12. The fourth electrode portion 14 is provided on the third electrode portion 13.

In some embodiments, the insulating section 20 includes a first insulating portion 21, a second insulating portion 22, a third insulating portion 23, and a fourth insulating portion 24. The first insulating portion 21 is arranged side by side with the first electrode portion 11 in the X-direction. In other words, a part of the first insulating portion 21 is arranged side by side with the lower end of the FP electrode 10 in the X-direction. The second insulating portion 22 is arranged side by side with the second electrode portion 12 in the X-direction. The third insulating portion 23 is arranged side by side with the third electrode portion 13 in the X-direction. The fourth insulating portion 24 is arranged side by side with the fourth electrode portion 14 in the X-direction.

In some embodiments, as viewed in the Z-direction, the length L1 of the first electrode portion 11 is greater than the length L2 of the second electrode portion 12. Furthermore, as viewed in the Z-direction, the length L3 of the third electrode portion 13 is greater than the length L4 of the fourth electrode portion 14 and is less than the length L2 of the second electrode portion 12.

In some embodiments, the respective lengths of the first insulating portion 21 to the fourth insulating portion 24 in the Z-direction are respectively equal to the respective lengths of the first electrode portion 11 to the fourth electrode portion 14 in the Z-direction.

Thus, the lengths of the respective electrode portions included in the FP electrode 10 in the Z-direction and the lengths of the respective insulating portions included in the insulating section 20 in the Z-direction are set in such a manner that the lower a portion is, the greater is the length of the portion.

In some embodiments, the thickness (e.g., a length in the X-direction) T1 of the first insulating portion 21 is greater than the thickness T2 of the second insulating portion 22. Furthermore, the thickness T3 of the third insulating portion 23 is less than the thickness T2 of the second insulating portion 22 and is greater than the thickness T4 of the fourth insulating portion 24.

Thus, the thicknesses of the first insulating portion 21 to the fourth insulating portion 24 are set in such a manner that the lower an insulating portion is, the greater is the thickness of the insulating portion.

In some embodiments, the respective lengths of the first electrode portion 11 to the fourth electrode portion 14 in the X-direction are approximately the same.

The relationship between the widths (e.g., the lengths in the X-direction) of the $n^-$-type semiconductor region 1 between the respective adjacent insulating portions is as follows.

In some embodiments, the width W3 between the adjacent third insulating portions 23 is less than the width W4 between the adjacent fourth insulating portions 24. The width W2 between the adjacent second insulating portions 22 is less than the width W3 between the adjacent third insulating portions 23 and is greater than the width W1 between the adjacent first insulating portions 21.

Thus, the widths of the $n^-$-type semiconductor region 1 between the respective adjacent insulating portions are set in such a manner that the lower adjacent insulating portions are, the less is the width between the adjacent insulating portions.

Furthermore, in some embodiments, each of the width W1 to the width W4 is less than the width W5 of the $n^-$-type semiconductor region 1 or the p-type base region 2 between adjacent gate insulating sections 31. In some embodiments, each of the width W1 to the width W5 is less than the distance D1 of the $n^-$-type semiconductor region 1 between adjacent FP electrodes 10.

Here, examples of materials of the respective constituent elements are described.

The $n^+$-type drain region 5, the $n^-$-type semiconductor region 1, the p-type base region 2, the $n^+$-type source region 3, and the $p^+$-type contact region 4 may each include at least one of silicon, silicon carbide, gallium nitride, or gallium arsenide as a semiconductor material. These regions may include the same semiconductor material, or two or more of these regions may include different semiconductor materials. In a case where silicon is used as a semiconductor material, arsenic, phosphorus, or antimony can be used as an n-type impurity. Boron can be used as a p-type impurity.

The FP electrode 10 and the gate electrode 30 may each include a conductive material such as polycrystalline silicon (or polysilicon). The FP electrode 10 and the gate electrode 30 may include the same conductive material, or may include different conductive materials.

The insulating section 20, the gate insulating section 31 and the insulating layer 35 may each include an insulating material such as silicon oxide or silicon nitride. The insulating section 20, the gate insulating section 31 and the insulating layer 35 may include the same insulating material, or may include different insulating materials.

The drain electrode 41 and the source electrode 42 may each include a metal such as aluminum. The drain electrode 41 and the source electrode 42 may include the same metal, or may include different metals.

Next, an example of a process for manufacturing the semiconductor device 100 according to some embodiments is described with reference to FIG. 3A, FIG. 3B, FIG. 3C, FIG. 3D, FIG. 4A, FIG. 4B, FIG. 4C, and FIG. 4D.

FIG. 3A, FIG. 3B, FIG. 3C, FIG. 3D, FIG. 4A, FIG. 4B, FIG. 4C, and FIG. 4D are process cross-sectional views illustrating a manufacturing process for the semiconductor device 100 according to some embodiments.

First, in some embodiments, the manufacturing process includes preparing a semiconductor substrate which includes an $n^+$-type semiconductor layer 5a and an $n^-$-type semiconductor layer 1a. A mask M subjected to patterning is formed on the $n^-$-type semiconductor layer 1a. Using the mask M, a plurality of trenches Tr1 are formed on the surface of the $n^-$-type semiconductor layer 1a with the use of, for example, a reactive ion etching (RIE) method. Then, an insulating layer IL1 is formed on the inner wall of the trench Tr1 with the use of, for example, a chemical vapor deposition (CVD) method (see FIG. 3A).

Next, in some embodiments, the insulating layer IL1 formed at the bottom portion is selectively removed with the use of anisotropic etching such as RIE. This process causes the $n^-$-type semiconductor layer 1a to be exposed on the bottom portion of the trench Tr1. Then, the exposed $n^-$-type semiconductor layer 1a is etched with the use of, for example, anisotropic etching. After that, the $n^-$-type semiconductor layer 1a is isotropically etched with the use of, for example, wet etching. With this, a trench Tr2 is formed, where the trench Tr2 is deeper than the trench Tr1 and the width of the bottom portion of which is greater than the width of the trench Tr1 (see FIG. 3B).

Next, in some embodiments, an insulating layer IL2 is formed on the inner wall of the trench Tr2 with the use of, for example, the CVD method. Then, a part of the insulating layer IL2 is removed to cause the $n^-$-type semiconductor layer 1a at the bottom portion of the trench Tr2 to be exposed, and anisotropic etching and isotropic etching are performed. With this, a trench Tr3 is formed, where the trench Tr3 is deeper than the trench Tr2 and the width of the bottom portion of which is greater than the width of the trench Tr2 (see FIG. 3C).

Moreover, in FIG. 3C, an insulating layer including the insulating layer IL1, which is formed first, and the insulating layer IL2, which is formed next on the inner wall of the trench Tr2, is illustrated as the insulating layer IL2.

Next, in some embodiments, an insulating layer IL3 is formed on the inner wall of the trench Tr3 with the use of, for example, the CVD method. Then, a part of the insulating layer IL3 is removed to cause the $n^-$-type semiconductor layer 1a at the bottom portion of the trench Tr3 to be exposed, and anisotropic etching and isotropic etching are performed. With this, a trench Tr4 is formed, where the trench Tr4 is deeper than the trench Tr3 and the width of the bottom portion of which is greater than the width of the trench Tr3 (see FIG. 3D).

Moreover, in FIG. 3D, an insulating layer including the insulating layer IL1, which is formed first, the insulating layer IL2, which is formed next on the inner wall of the trench Tr2, and the insulating layer IL3, which is formed next on the inner wall of the trench Tr3, is illustrated as the insulating layer IL3.

After that, in some embodiments, the manufacturing process repeats similarly to the above-mentioned process to sequentially form a trench Tr5 (and an insulating layer IL4) illustrated in FIG. 4A.

Next, in some embodiments, after removing the mask M, thermal oxidation is performed to form an insulating layer on the inner wall of the trench Tr5 and the upper surface of the $n^-$-type semiconductor layer 1a. An insulating layer IL5 is further formed by accumulating insulating materials formed by, for example, thermal oxidation, and the inside of the trench Tr5 is filled with the insulating layer IL5 (see FIG. 4B). Then, a trench Tr6 is formed in the insulating layer IL5 (see FIG. 4B).

Next, in some embodiments, a conductive layer CL is formed on the insulating layer IL5 to fill the trench Tr6 with the conductive layer CL. Etch-back is performed on the conductive layer CL so that the FP electrode 10 and the gate electrode 30 (see FIG. 1 and FIG. 2) are integrally provided inside the trench Tr6. Then, in some embodiments, a p-type impurity and an n-type impurity are sequentially injected into the surface of the $n^-$-type semiconductor layer 1a covered with the insulating layer IL5 by, for example, ion implantation, thus forming the p-type base region 2 and the $n^+$-type source region 3. Then, in some embodiments, an insulating layer IL6, which covers the conductive layer CL, is formed on the insulating layer IL5. In some embodiments, the manufacturing process further includes forming a trench Tr7, which penetrates through the $n^+$-type source region 3 and leads to the p-type base region 2, in the insulating layer IL6. Then, in some embodiments, a p-type impurity is injected into the exposed p-type base region 2 by, for example, ion implantation, thus forming the $p^+$-type contact region 4 (see FIG. 4C).

Next, in some embodiments, a metal layer is formed on the insulating layer IL6. The trench Tr7 is thus filled with the metal layer. Patterning is performed on the metal layer to form the source electrode 42. Then, in some embodiments, the back surface of the $n^+$-type semiconductor layer 5a is ground until the thickness of the $n^+$-type semiconductor layer 5a reaches a predetermined thickness. After that, in some embodiments, a metal layer is formed on the back surface of the $n^+$-type semiconductor layer 5a, thus forming the drain electrode 41 (see FIG. 4D).

According to the above-described process, the semiconductor device 100 illustrated in FIG. 1 and FIG. 2 is attained.

Here, functions and advantageous effects obtained by some embodiments are described with reference to FIG. 5.

FIG. 5 is a cross-sectional view illustrating equipotential lines in a portion of the semiconductor device 100 according to some embodiments.

In FIG. 5, dashed lines represent equipotential lines appearing when the semiconductor device 100 is in an off-state.

When the semiconductor device 100 is in an off-state, in the vicinity of the FP electrode 10, the equipotential lines pass through the insulating section 20 along the outer edge of the FP electrode 10. Then, the equipotential lines, after exiting the insulating section 20 and passing through the $n^-$-type semiconductor region 1, enter an adjacent insulating section 20 and pass through the adjacent insulating section 20 along the outer edge of an adjacent FP electrode 10. At this time, the equipotential lines passing through the insulating section 20 leave from the insulating section 20 to the $n^-$-type semiconductor region 1 along varied directions with a variation in thickness of the portion of the insulating section 20 through which the equipotential lines pass, as illustrated in FIG. 5.

On the other hand, in a case where the insulating section 20 has a uniform thickness, parts of the equipotential lines leave from the insulating section 20 to the n⁻-type semiconductor region 1 in the vicinity of the lower end of the FP electrode 10 and in the vicinity of the p-n junction surface between the n⁻-type semiconductor region 1 and the p-type base region 2. Therefore, the equipotential lines concentrate at these portions (e.g., in the vicinity of the lower end of the FP electrode 10 and in the vicinity of the p-n junction surface between the n⁻-type semiconductor region 1 and the p-type base region 2), so that the electric field strength becomes high.

In other words, by configuring the thickness of the insulating section 20 to become greater as the portion thereof comes closer to the lower end, as in the semiconductor device 100 according to some embodiments (e.g., as shown in FIG. 1, FIG. 2 and FIG. 5), a concentration of equipotential lines in the n⁺-type semiconductor region 1 between the adjacent insulating sections 20 can be reduced, as compared with a case of the thickness of the insulating section 20 being uniform. Therefore, according to some embodiments (e.g., as shown in FIG. 1, FIG. 2 and FIG. 5), the electric field strength in the n⁻-type semiconductor region 1 when the semiconductor device 100 is in an off-state can be decreased, and thus, the breakdown voltage of the semiconductor device 100 can be improved (or increased).

Furthermore, in the semiconductor device 100 according to some embodiments, as the thickness of the insulating section 20 becomes greater as the portion thereof comes closer to the lower end, the width of the n⁻-type semiconductor region 1 between the adjacent insulating sections 20 becomes smaller. Employing such a structure can facilitate depletion of the n⁻-type semiconductor region 1 between the adjacent insulating sections 20 with a depletion layer extending from the insulating section 20 in the X-direction, even in a case where the n-type impurity concentration in the n⁻-type semiconductor region 1 is high.

In other words, configuring the width of the n⁻-type semiconductor region 1 to become smaller as the portion thereof comes closer to the lower end can increase the n-type impurity concentration in the n⁻-type semiconductor region 1 and thus reducing the on-state resistance of the semiconductor device 100.

To reduce the resistance of an inversion channel formed in the p-type base region 2 in an on-state and, at the same time, increase the breakdown voltage of the semiconductor device 100, in some embodiments, the thickness (the length in the X-direction) of the insulating section 20 is greater than the thickness of the gate insulating section 31. Also, making the width (e.g., the length in the X-direction) of the gate electrode 30 approximately equal to the width of the FP electrode 10 can decrease the width of the n⁻-type semiconductor region 1 between the adjacent insulating sections 20 and, at the same time, increasing the interval between the adjacent gate insulating sections 31. In other words, even in a case where the interval between the adjacent insulating sections 20 is reduced to increase the n-type impurity concentration of the n⁻-type semiconductor region 1, any decrease in area of the p-type base region 2 and the n⁺-type source region 3 and the p⁺-type contact region 4, which are provided on the p-type base region 2, can be prevented or reduced. In particular, in a case where the area of the p⁺-type contact region 4 is small, the resistance for holes increases, and, when a semiconductor device is switched from an on-state to an off-state, a parasitic transistor tends to operate. However, according to the above-described structure (e.g., the thickness of the insulating section 20 is greater than the thickness of the insulating section 31 and the thickness of the gate electrode 30 is approximately equal to the thickness of the FP electrode 10), since any decrease in area of the p⁺-type contact region 4 can be prevented or reduced, a reduction in breakdown resistance (e.g., breakdown voltage) when the semiconductor device 100 is switched from an on-state to an off-state can be prevented or decreased.

In other words, making the insulating section 20 thicker than the gate insulating section 31 and making the width of the gate electrode 30 approximately equal to the width of the FP electrode 10 can prevent or decrease a reduction in breakdown resistance (e.g., breakdown voltage) and, at the same time, decreasing on-state resistance.

Furthermore, in some embodiments, in the semiconductor device 100, the FP electrode 10 and the gate electrode 30 may be integrally provided. Thus, when the semiconductor device 100 is in an on-state, a gate voltage is also applied to the FP electrode 10, and an accumulation channel is formed in the vicinity of the interface of the n⁻-type semiconductor region 1 with the insulating section 20. In this case, the thickness of the insulating section 20 becoming greater in stages as the portion thereof from the gate insulating section 31 comes closer to the lower end, as in some embodiments (e.g., as shown in FIG. 1, FIG. 2 and FIG. 5), can make the flow of electrons in the accumulation channel unlikely to be blocked, as compared with a case where the thickness of the insulating section 20 is uniform and there is a large difference between the thickness of the gate insulating section 31 and the thickness of the insulating section 20. In other words, the thickness of the insulating section 20 becoming greater in stages as the portion thereof comes closer to the lower end can reduce the resistance to electrons in the accumulation channel and decrease the on-state resistance of the semiconductor device 100.

Moreover, in the semiconductor device 100 according to some embodiments, the first insulating portion 21 to the fourth insulating portion 24 are greater in length in the Z-direction in the order of the one closer to the lower end. In other words, the insulating portion, at which the width of the n⁻-type semiconductor region 1 between the adjacent insulating sections 20 is smaller, has a greater length in the Z-direction (see FIG. 2). Employing such a structure can further reduce concentration of equipotential lines in the n⁺-type semiconductor region 1 between the adjacent insulating sections 20 and thus improving the breakdown voltage of the semiconductor device 100.

Here, an example of the relationship between the respective dimensions illustrated in FIG. 2 and functions and advantageous effects thereof are described.

In some embodiments, the width W1 is set to 0.01 times or more and 0.6 times or less the width W5. This setting can maintain the sufficient area of the p-type base region 2 and, at the same time, increasing the n-type impurity concentration in the n⁻-type semiconductor region 1.

In some embodiments, in a case where the length L5 of the FP electrode 10 in the Z-direction is 1.0 µm or more and 2.5 µm or less, the thickness T1 can be 0.1 µm or more and 0.3 µm or less.

In some embodiments, in a case where the length L5 is 2.0 µm or more and 3.5 µm or less, the thickness T1 can be 0.3 µm or more and 0.5 µm or less.

In some embodiments, in a case where the length L5 is 3.0 µm or more and 5.0 µm or less, the thickness T1 can be 0.4 µm or more and 0.8 µm or less.

In some embodiments, in a case where the length L5 is 4.0 µm or more and 8.0 µm or less, the thickness T1 can be 0.6 µm or more and 1.2 µm or less.

In some embodiments, in a case where the length L5 is 6.0 µm or more and 16.0 µm or less, the thickness T1 can be 1.0 µm or more and 2.0 µm or less.

Additionally, the length L5 of the FP electrode 10 in the Z-direction is expressed by, for example, the distance in the Z-direction between the boundary surface between the n⁻-type semiconductor region 1 and the p-type base region 2 and the lower end of the FP electrode 10.

In some embodiments, in either case, the length L5 can be 5 times or more and 15 times or less the thickness T1.

In the above-described semiconductor device 100 illustrated in FIG. 1 and FIG. 2, a case has been described in which the FP electrode 10 and the gate electrode 30 are integrally provided. However, other embodiments are not limited to this structure. For example, the FP electrode 10 and the gate electrode 30 can be provided separately from each other, as illustrated in FIG. 6.

Figure 6:
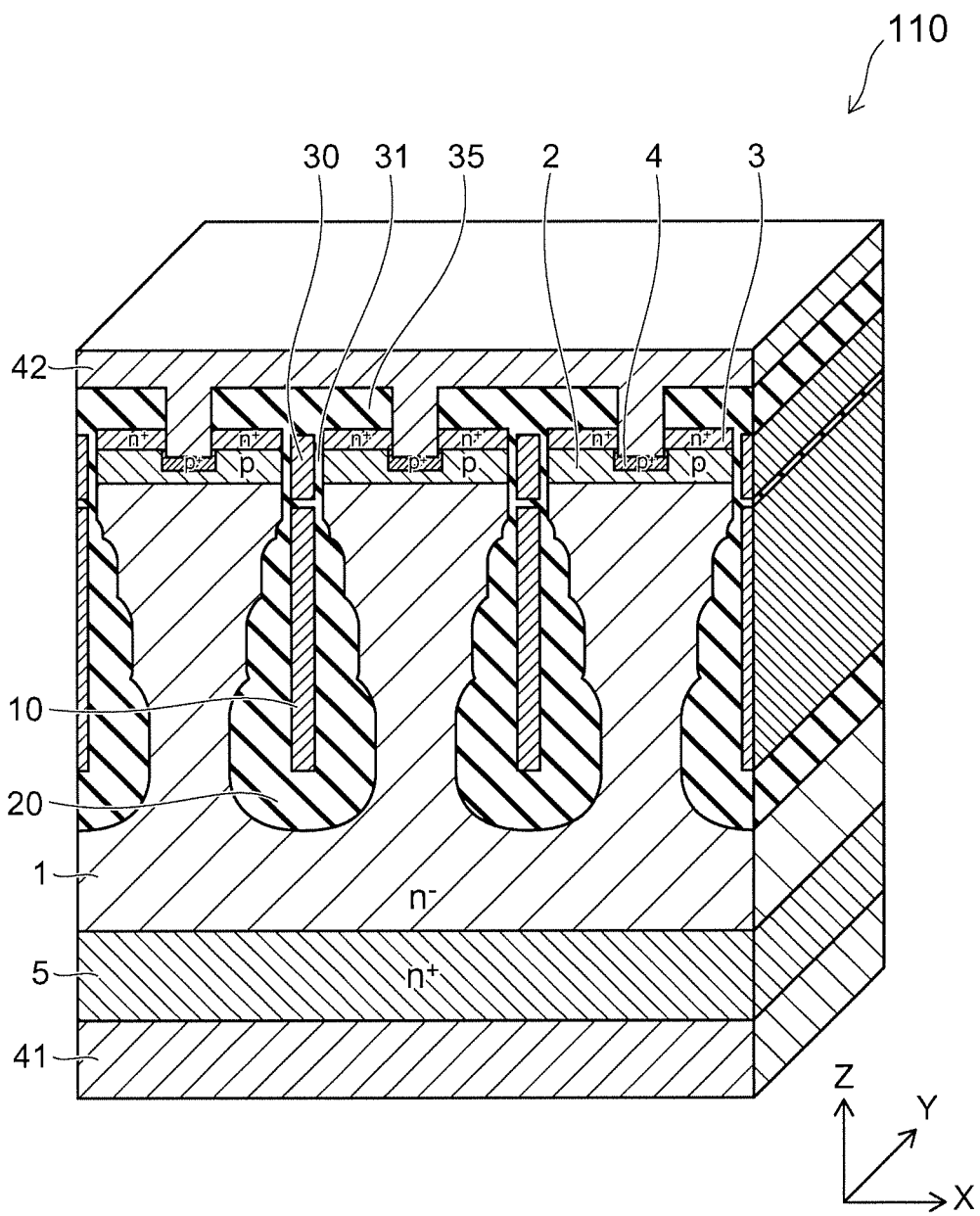
FIG. 6 is a cross-sectional view illustrating a part of a semiconductor device according to a modification example of some embodiments.

FIG. 6 is a cross-sectional view illustrating a part of a semiconductor device 110 as a modification example according to some embodiments.

In some embodiments, in the semiconductor device 110, the FP electrode 10 is electrically connected to the gate electrode 30 or the source electrode 42. Even in a case where the FP electrode 10 is connected to either of the gate electrode 30 or the source electrode 42, when the semiconductor device 110 is in an off-state, a potential difference between such electrodes and the drain electrode 41 allows a depletion layer to spread from the interface between the insulating section 20 and the n⁻-type semiconductor region 1 toward the n⁻-type semiconductor region 1.

This also allows the semiconductor device 110 to have functions and advantageous effects similar to those of the semiconductor device 100 (see FIG. 1, FIG. 2 and FIG. 5).

In the above-described embodiments, the relative highness or lowness of the impurity concentration between the respective semiconductor regions can be checked using, for example, a scanning capacitance microscope (SCM). Additionally, in some embodiments, the carrier concentration in each semiconductor region can be deemed to be equal to the concentration of impurities activated in each semiconductor region. Accordingly, the relative highness or lowness of the carrier concentration between the semiconductor regions can also be checked using the SCM.

Furthermore, the impurity concentration in each semiconductor region can be measured by, for example, secondary ion mass spectrometry (SIMS).

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. Specific structures of various elements included in the embodiments, such as the n⁺-type drain region 5, the n⁻-type semiconductor region 1, the p-type base region 2, n⁺-type source region 3, the p⁺-type contact region 4, the FP electrode 10, the insulating section 20, the gate electrode 30, the gate insulating section 31, the insulating layer 35, the drain electrode 41, and the source electrode 42, can be selected as appropriate by a person skilled in the art. The accompanying claims and their equivalents are intended to cover such forms or modifications as would fall within the scope and spirit of the present disclosure. Moreover, some or all of the above-described embodiments can be combined when implemented.

What is claimed is:

1. A semiconductor device comprising:
   a first semiconductor region of a first conductivity type;
   a second semiconductor region of a second conductivity type provided on the first semiconductor region;
   a third semiconductor region of the first conductivity type selectively provided on the second semiconductor region;
   a first electrode surrounded by the first semiconductor region, the first electrode including
      a first electrode portion including a first end of the first electrode in a first direction from the first semiconductor region to the second semiconductor region, and
      a second electrode portion provided on the first electrode portion;
   a first insulating section provided between the first electrode and the first semiconductor region, the first insulating section including
      a second insulating portion arranged side by side with the second electrode portion in a second direction perpendicular to the first direction, and
      a first insulating portion arranged side by side with the first electrode portion in the second direction, a length of the first insulating portion in the first direction being greater than a length of the second insulating portion in the first direction, and a thickness of the first insulating portion in the second direction being greater than a thickness of the second insulating portion in the second direction;
   a gate electrode provided on a second end of the first electrode opposite the first end in the first direction such that a width of the gate electrode in the second direction is approximately equal to a width of the first electrode portion in the second direction; and
   a gate insulating section provided between the gate electrode and the second semiconductor region.

2. The semiconductor device according to claim 1, further comprising a plurality of first electrodes including the first electrode, each of the plurality of first electrodes including a corresponding first electrode portion and a corresponding second electrode portion,
   and further comprising a plurality of first insulating sections including the first insulating section, each of the plurality of first insulating sections including a corresponding first insulating portion and a corresponding second insulating portion,
   each of the plurality of first insulating sections is provided between a corresponding one of the plurality of first electrodes and the first semiconductor region, and
   a length of the first semiconductor region between adjacent second insulating portions in the second direction is greater than a length of the first semiconductor region between adjacent first insulating portions in the second direction.

3. The semiconductor device according to claim 2, further comprising a plurality of gate electrodes including the gate electrode,
   and further comprising a plurality of gate insulating sections including the gate insulating section, each of the plurality of gate electrodes is provided on a corresponding one of the plurality of first electrodes, each of the plurality of gate insulating sections is provided between a corresponding one of the plurality of gate electrodes and the second semiconductor region, and a length of the first semiconductor region between adjacent first insulating portions in the second direction is 0.01 times or more and 0.6 times or less a distance between adjacent gate insulating sections in the second direction.

4. The semiconductor device according to claim 1, wherein a length of the first electrode in the first direction is 5 times or more and 15 times or less a thickness of the first insulating portion in the second direction.

5. The semiconductor device according to claim 1, wherein the width of the gate electrode in the second direction is approximately equal to the width of the first electrode in the second direction.

6. The semiconductor device according to claim 1, wherein a thickness of the gate insulating section in the second direction is less than the thickness of the first insulating portion.

7. The semiconductor device according to claim 1, further comprising:
a fourth semiconductor region of the second conductivity type selectively provided on the second semiconductor region; and
a source electrode provided on the third semiconductor region and the fourth semiconductor region and electrically connected to the third semiconductor region and the fourth semiconductor region.

8. The semiconductor device according to claim 1, wherein the first electrode and the gate electrode are separate from each other.

9. A semiconductor device comprising:
a first semiconductor region of a first conductivity type;
a second semiconductor region of a second conductivity type provided on the first semiconductor region;
a third semiconductor region of the first conductivity type selectively provided on the second semiconductor region;
a fourth semiconductor region of the second conductivity type selectively provided on the second semiconductor region;
a first electrode surrounded by the first semiconductor region;
a first insulating section provided between the first electrode and the first semiconductor region;
a gate electrode provided on one end portion of the first electrode in a first direction from the first semiconductor region to the second semiconductor region, a width of the gate electrode in a second direction perpendicular to the first direction being approximately equal to a width of another end portion of the first electrode in the second direction, the another end portion being opposite the one end portion in the first direction;
a gate insulating section provided between the gate electrode and the second semiconductor region, a thickness of the gate insulating section in the second direction being less than a thickness of the first insulating section in the second direction; and
a source electrode provided on the third semiconductor region and the fourth semiconductor region and electrically connected to the third semiconductor region and the fourth semiconductor region.

10. The semiconductor device according to claim 9, wherein the first electrode includes a first electrode portion, and a second electrode portion provided on the first electrode portion.

11. The semiconductor device according to claim 10, wherein the first insulating section includes:
a first insulating portion arranged side by side with the first electrode portion in the second direction, and
a second insulating portion arranged side by side with the second electrode portion in the second direction.

12. The semiconductor device according to claim 11, wherein a length of the first insulating portion in the first direction is greater than a length of the second insulating portion in the first direction.

13. The semiconductor device according to claim 11, wherein a thickness of the first insulating portion in the second direction is greater than a thickness of the second insulating portion in the second direction.

14. The semiconductor device according to claim 11, wherein a length of the first electrode in the first direction is 5 times or more and 15 times or less a thickness of the first insulating portion in the second direction.

15. The semiconductor device according to claim 9, further comprising a plurality of first electrodes including the first electrode,
and further comprising a plurality of first insulating sections including the first insulating section, each of the plurality of first insulating sections including a corresponding first insulating portion and a corresponding second insulating portion, and
each of the plurality of first insulating sections is provided between a corresponding one of the plurality of first electrodes and the first semiconductor region.

16. The semiconductor device according to claim 15, wherein a length of the first semiconductor region between adjacent second insulating portions in the second direction is greater than a length of the first semiconductor region between adjacent first insulating portions in the second direction.

17. The semiconductor device according to claim 15, further comprising a plurality of gate electrodes including the gate electrode,
and further comprising a plurality of gate insulating sections including the gate insulating section, and
each of the plurality of gate electrodes is provided on a corresponding one of the plurality of first electrodes.

18. The semiconductor device according to claim 17, wherein each of the plurality of gate insulating sections is provided between a corresponding one of the plurality of gate electrodes and the second semiconductor region.

19. The semiconductor device according to claim 18, wherein a length of the first semiconductor region between adjacent first insulating portions in the second direction is 0.01 times or more and 0.6 times or less a distance between adjacent gate insulating sections in the second direction.

20. The semiconductor device according to claim 9, wherein the first electrode and the gate electrode are separate from each other.

* * * * *